(12) United States Patent
Onodera

(10) Patent No.: US 8,134,423 B2
(45) Date of Patent: Mar. 13, 2012

(54) NOISE FILTER AND NOISE-FILTER-INCORPORATED AMPLIFIER CIRCUIT

(75) Inventor: Eio Onodera, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 602 days.

(21) Appl. No.: 12/401,317

(22) Filed: Mar. 10, 2009

(65) Prior Publication Data

US 2009/0243755 A1    Oct. 1, 2009

(30) Foreign Application Priority Data

Mar. 28, 2008 (JP) ................................. 2008-086636

(51) Int. Cl.
*H03H 7/06* (2006.01)

(52) U.S. Cl. ......................................... 333/12; 333/172
(58) Field of Classification Search .................. 333/138, 333/167, 172, 12

See application file for complete search history.

(56) References Cited

U.S. PATENT DOCUMENTS

| | | | |
|---|---|---|---|
| 4,338,576 A * | 7/1982 | Takahashi et al. | 331/67 |
| 6,788,168 B2 * | 9/2004 | Guitton et al. | 333/170 |
| 7,408,793 B2 * | 8/2008 | Jitaru et al. | 363/52 |
| 7,825,750 B2 * | 11/2010 | Lee et al. | 333/194 |

FOREIGN PATENT DOCUMENTS

| | | |
|---|---|---|
| JP | 2006-514497 | 4/2006 |
| JP | 2007-267168 | 10/2007 |

\* cited by examiner

*Primary Examiner* — Dean O Takaoka
*Assistant Examiner* — Alan Wong
(74) *Attorney, Agent, or Firm* — Morrison & Foerster LLP

(57) ABSTRACT

A ladder LPF includes a first capacitor formed of a transistor in which two terminals out of three are diode-connected, and a second capacitor formed by connecting a pn junction capacitor and an insulating capacitor in parallel. In the second capacitor, the pn junction capacitor formed in a semiconductor layer and the insulating capacitor formed in a surface of the semiconductor layer are connected to each other in parallel so as to almost overlap each other. Accordingly, the area in the LPF occupied by the second capacitor can be prevented from increasing even when its capacitance value is increased. Moreover, having the snap-back characteristics, the first capacitor can protect the second capacitor having the insulating capacitor from ESD. As a result, what can be obtained is a compact noise filter having high RFI removal characteristics and accomplishing high resistance to ESD.

5 Claims, 4 Drawing Sheets

Prior Art it its input terminal IN to one end of an ECM 560. The noise

NOISE FILTER AND NOISE-FILTER-INCORPORATED AMPLIFIER CIRCUIT

This application claims priority from Japanese Patent Application No. JP2008-086636 filed on Mar. 28, 2008, the content of which is incorporated herein by reference in its entirety

BACKGROUND OF THE INVENTION

1. Field of the Invention

The present invention relates to a noise filter and a noise-filter-incorporated amplifier circuit. Particularly, the present invention relates to a noise filter and a noise-filter-incorporated amplifier circuit in which radio frequency interference (RFI) removal characteristics is improved.

2. Background Art

An amplifier device is employed to perform impedance transformation and amplification in an electret condenser microphone (ECM). The amplifier device is formed, for example, of a junction field effect transistor (J-FET) or an amplifier integrated circuit device.

When the ECM is mounted, for example, on a mobile phone, a radio wave having a radio frequency of the mobile phone affects interconnections or associated parts for the ECM, and is detected as a noise of the ECM.

Various types of noise filters are used to improve RFI removal characteristics by preventing noise, such as a signal, from leaking or intruding through the interconnections. (This technology is described for instance in Japanese Patent Application Publication No. 2007-267168 and Japanese Translation of PCT International Application No. 2006-514497.)

FIGS. 5A and 5B are circuit diagrams showing conventional noise filters 510 and 511 to be connected to amplifier integrated circuit devices for impedance transformation, respectively. The noise filters 510 and 511 are, for example, low-pass filter (LPF) type electromagnetic interference (EMI) filters for preventing electromagnetic interference.

The noise filter 510 shown in FIG. 5A is obtained by connecting two capacitors C11 and C12 in parallel and by serially connecting a resistance R between one ends of the respective two capacitors C11 and C12 on their high voltage sides. The noise filter 510 is connected at its input terminal Vi' to a power supply and at its output terminal Vo' to an amplifier integrated circuit device (not shown).

This circuit is an LPF obtained by connecting the two capacitors C11 and C12 in a ladder manner and connecting the resistance between them. When the LPF circuit is connected to the amplifier integrated circuit device, incoming RF noise can be cut off by the LPF before reaching the amplifier integrated circuit device. Thereby, the RF noise which would otherwise affect the amplifier integrated circuit device can be drastically reduced, so that the RFI condition of the ECM can be improved.

The noise filter 511 shown in FIG. 5B is obtained by connecting diodes D1 and D2 instead of the capacitors C11 and C12. The noise filter 511 is an LPF which uses junction capacitors C21 and C22 of the diodes D1 and D2 as the capacitors C11 and C12 shown in FIG. 5A.

It is possible to integrate the LPF onto one chip with the amplifier circuit device, or with the J-FET or a p-channel metal oxide semiconductor field effect transistor (MOSFET) both of which are employed for impedance transformation like the amplifier integrated circuit device. In this case, the junction capacitors of the diodes D1 and D2 are generally used as shown in FIG. 5B from the viewpoint of the electrostatic discharge (ESD) and the manufacturing process.

FIG. 6 is a circuit diagram showing an example of a case where the noise filter 511 shown in FIG. 5B is connected to an amplifier integrated circuit device 550.

The amplifier integrated circuit device 550 is connected at its input terminal IN to one end of an ECM 560. The noise filter 511 is connected at its output terminal Vo' on the high voltage side and at its output terminal (GND) on a low voltage side to the amplifier integrated circuit device 550 in parallel. Accordingly, the noise filter 511 and the amplifier integrated circuit device 550 can be integrated onto one chip.

In the noise filter 511 employing the diodes D1 and D2, a cut-off frequency fc is determined based on capacitance values of the junction capacitors C21 and C22 of the diodes D1 and D2 and on a resistance value of the resistance R. To satisfactorily improve the RFI condition, the cut-off frequency fc of the filter needs to be decreased. To decrease the cut-off frequency fc, either the capacitance values or the resistance value needs to be increased.

Increasing the capacitance values causes a problem of enlarging the size of the noise filter 511 or the chip size of a noise-filter incorporated amplifier integrated circuit device onto which the noise filter 511 and the amplifier integrated circuit device 550 are integrated.

Increasing the resistance value of the resistance R, on the other hand, causes a problem of output reduction (output loss) of the EMC 560. This is because the increase in the resistance value decreases a voltage outputted from the noise filter 511 to be applied to the amplifier integrated circuit device 550.

SUMMARY OF THE INVENTION

The invention provides a noise filter including a junction capacitor having a transistor with three terminals in which two of the three terminals are diode-connected, a combination capacitor having a pn junction capacitor and an insulating capacitor that are connected in parallel, and a resistor. The resistor is connected to the high voltage side of the junction capacitor to receive an input and is connected to the high voltage side of the combination capacitor to provide an output. The low voltage side of the junction capacitor and the low voltage side of the combination capacitor are connected to a reference voltage.

The invention also provides a noise-filter-incorporated amplifier circuit that includes a noise filter having a junction capacitor having a transistor with three terminals in which two of the three terminals are diode-connected, a combination capacitor having a pn junction capacitor and an insulating capacitor that are connected in parallel, and a resistor. The amplifier circuit also includes an amplifier device. The resistor is connected between the junction capacitor and the combination capacitor, the high voltage side of the junction capacitor is configured to be the input terminal of the noise filter, the high voltage side of the combination capacitor is configured to be the output terminal of the noise filter, the low voltage side of the junction capacitor and the low voltage side of the combination capacitor are connected to a reference voltage, and the amplifier device is connected to the output terminal of the noise filter.

The invention further provides a noise-filter-incorporated amplifier circuit that includes a semiconductor layer of a first conductivity type and a noise filter formed on the semiconductor layer and comprising a junction capacitor comprising a transistor with three terminals in which two of the three terminals are diode-connected, a combination capacitor comprising a pn junction capacitor and an insulating capacitor that are connected in parallel, and a resistor. The amplifier circuit also includes an amplifier device formed on the semiconductor layer. The resistor is connected between the junction capacitor and the combination capacitor, the high voltage side of the junction capacitor is configured to be the input terminal of the noise filter, the high voltage side of the combination capacitor is configured to be the output terminal of the noise filter, the low voltage side of the junction capacitor and the low voltage side of the combination capacitor are connected to a reference voltage, and the amplifier device is connected to the output terminal of the noise filter.

DESCRIPTION OF THE INVENTION

An embodiment of the invention will be described with reference to FIGS. 1 to 3.

Figure 1:
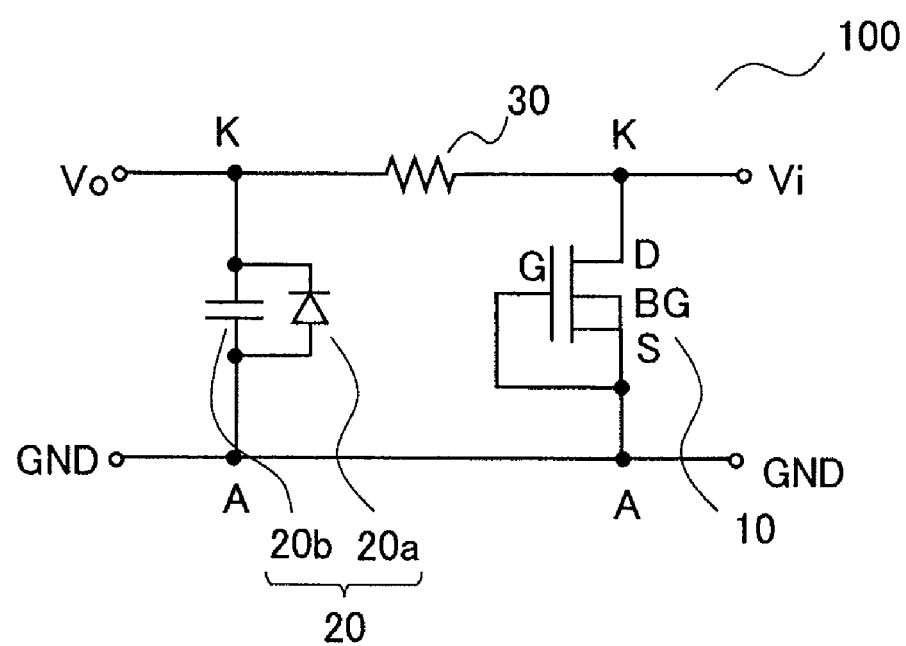
FIG. 1 is a circuit diagram explaining a noise filter according to an embodiment.

FIG. 1 is a circuit diagram showing a noise filter 100 according to the present embodiment.

The noise filter 100 includes a first capacitor 10, a second capacitor 20, and a resistance 30.

The first capacitor 10 is a junction capacitor of a transistor in which two terminals out of three are diode-connected. Specifically, the transistor is a metal oxide semiconductor field effect transistor (MOSFET) having a source S, a drain D, a gate G, and a back gate BG connected to the source S. The source S and the gate G are diode-connected and serve as an anode A. The drain D serves as a cathode K and as an input terminal Vi of the noise filter 100.

The anode A is connected to a low voltage side (GND), while the cathode K is connected to a high voltage side (a power source VDD through a load resistance $R_L$). Being applied a reverse bias, the first capacitor 10 operates not as a diode, but as a capacitor (see FIG. 2). GND means a reference voltage which is lower than the power source voltage VDD.

The second capacitor 20 is obtained by connecting a pn junction capacitor 20a and an insulating capacitor 20b in parallel. One end of the second capacitor 20 serves as the anode A, while the other end serves as the cathode K and as an output terminal Vo of the noise filter 100. The anode A is connected to the low voltage side (GND), while the cathode K is connected to the high voltage side (the power source VDD through the resistance 30 and the load resistance $R_L$). Accordingly, the pn junction capacitor 20a is applied a reverse bias, and the pn junction capacitor 20a operates not as a diode, but as a capacitor (see FIG. 2).

The resistance 30 is connected in series between the cathodes K (the high voltage side) of both the first capacitor 10 and the second capacitor 20. Thus, the noise filter 100 is configured as an n type.

The noise filter 100 is an electromagnetic interference (EMI) filter for, for example, preventing electromagnetic interference, and is called the EMI filter 100 below.

Figure 2:
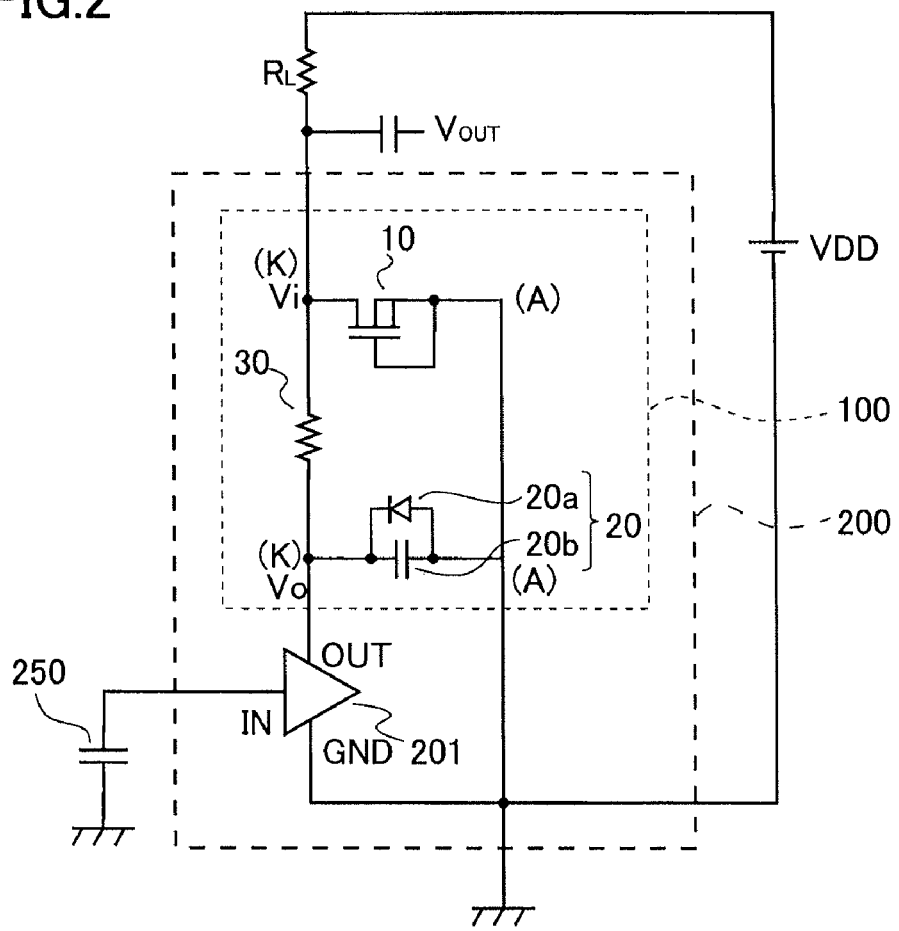
FIG. 2 is a circuit diagram explaining an EMI-filter-incorporated amplifier circuit according to the embodiment.

FIG. 2 is a circuit diagram showing an amplifier circuit 200 in which the EMI filter 100 shown in FIG. 1 is incorporated (which is called the EMI-filter-incorporated amplifier circuit 200 below).

An amplifier device 201 is formed of an amplifier-integrated circuit device, the J-FET, or the like. The amplifier device 201 is connected at its first terminal IN (Gate) to one end of an electret condenser microphone (ECM) 250, at its second terminal OUT (Drain) to the output terminal Vo side of the EMI filter 100, and at its third terminal GND (Source) to GND.

The EMI-filter-incorporated amplifier circuit 200 according to the present embodiment is an integrated circuit device in which the EMI filter 100 and the amplifier device 201 are thus integrated onto one chip.

The ECM 250 is formed by arranging, in a housing, a vibration film (a vibration plate) and an electrode opposite to the vibration film. Sound vibrates the vibration film, and such vibrations are extracted as changes in the electrostatic capacity between the vibration film and the electrode. The vibration film is for example made of a high polymer material to produce the electret effect, so that the vibration film can be electrically charged continuously.

The EMI-filter-incorporated amplifier circuit 200 is connected at its one end (the cathode K (input terminal Vi) of the first capacitor 10) to the power source VDD through the load resistance $R_L$. The other end of the EMI-filter-incorporated amplifier circuit 200 (the anode A of the first capacitor 10, the anode A of the second capacitor 20, and the third terminal (GND) of the amplifier device 201) is connected to the GND.

Compared to a cut-off frequency of the EMI filter 100, a current flowing through the second terminal (OUT) of the amplifier device 201 has a frequency (e.g., 100 kHz) low enough to pass through the EMI filter 100 without being cut off by the EMI filter 100. The current is then outputted as an output current of the EMI-filter-incorporated amplifier circuit 200. When the output current flows through the load resistance $R_L$, a difference in potential between both ends of the load resistance $R_L$ is produced. Change in the difference in potential (for AC) is then outputted as VOUT.

When an unneeded high frequency signal (RF noise) is transmitted to the EMI filter 100 from the power source VDD side or the load resistance $R_L$ side, the load resistance $R_L$ and the EMI filter 100 operate as a secondary LPF to let the RF noise out through the first capacitor 10 and the second capacitor 20. Here, the cut-off property of −12 dB/OCT maximum are exhibited.

By the secondary LPF, a high frequency signal having a radio frequency is prevented from being inputted into the amplifier device 201.

The second capacitor 20 according to the present embodiment is, although described in detail later, formed by arranging the pn junction capacitor 20a and the insulating capacitor 20b so as to almost overlap each other and to be connected in parallel. Here, the pn junction capacitor 20a is formed on a semiconductor layer; the insulating capacitor 20b is formed by forming an insulating film as a dielectric on the semiconductor layer and forming a conductive material on the insulating film. Accordingly, a capacitance value can be increased without increasing the size of the EMI filter 100. The RFI removal characteristics can be improved while preventing the increase in the chip size of the EMI-filter-incorporated amplifier circuit 200 in which the EMI filter 100 is incorporated.

Meanwhile, employing an insulating film as a dielectric, the insulating capacitor 20b has a structure vulnerable to the electrostatic discharge (ESD). In this respect, a MOSFET in which the two terminals are diode-connected is employed as the first capacitor 10 in the present embodiment. Accordingly, static electricity can be discharged satisfactorily by the first capacitor 10, allowing electrostatic which is to be applied to the second capacitor 20 to be attenuated to a great deal.

Figure 3:
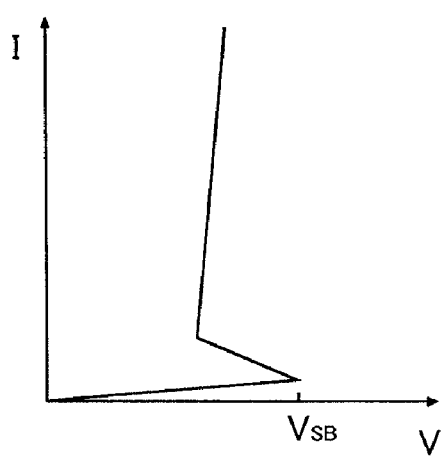
FIG. 3 is a characteristic diagram explaining the noise filter of the embodiment.

FIG. 3 shows a schematic diagram showing the current (I)-voltage (V) characteristics of the MOSFET being the first capacitor 10. Since, the MOSFET is diode-connected, the MOSFET has the snap-back characteristics and resistant to ESD. By designing the MOSFET so that its breakdown voltage may be equal to or lower than a voltage $V_{SB}$ being a snap-back point, the MOSFET can absorb static electricity satisfactorily. As a consequence, the second capacitor 20 and the amplifier device 201 can be protected from ESD.

Figure 4:
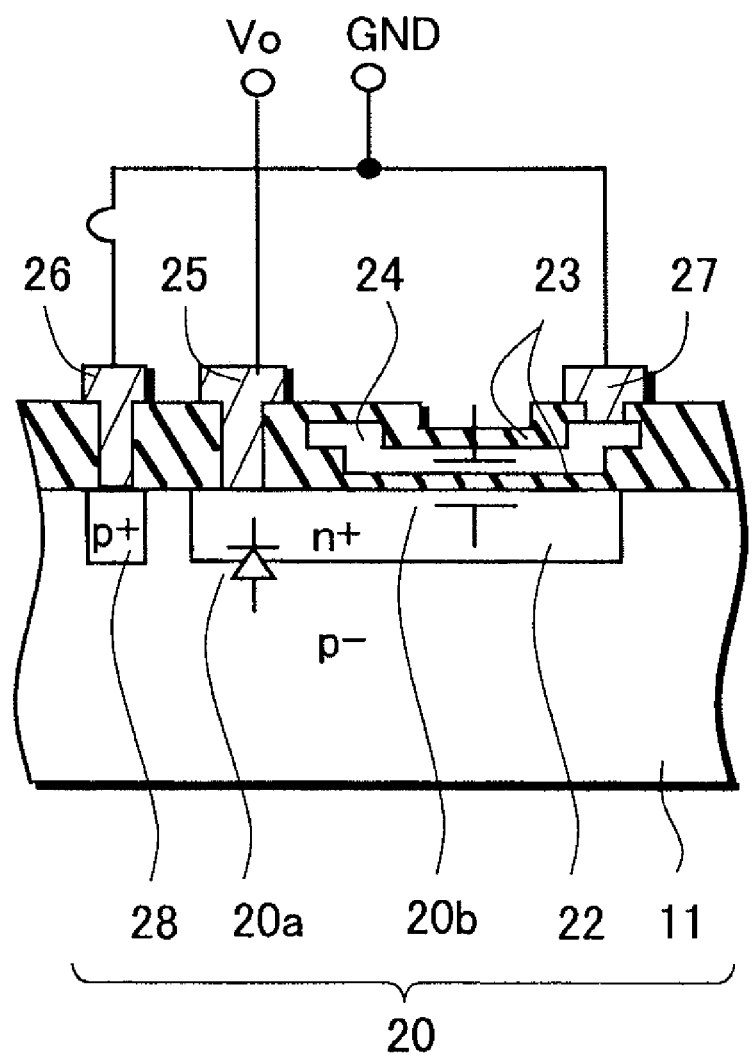
FIG. 4 is a cross-sectional diagram explaining a second capacitor of the EMI-filter-incorporated amplifier circuit according to the embodiment.

FIG. 4 is a cross-sectional diagram explaining the structure of the second capacitor 20 which is part of the EMI-filter-incorporated amplifier circuit 200 according to the present embodiment. Here, the description takes a p type semiconductor substrate as an example.

The second capacitor 20 is formed of the pn junction capacitor 20a and the insulating capacitor 20b. The pn junction capacitor 20a is formed as follows. An n type semiconductor region 22 in which an n type (n+ type) impurity is diffused is formed in a surface of a p− type semiconductor layer 11. Then, an insulating film 23 is formed on the surface of the p− type semiconductor layer 11. A first capacitor electrode (cathode electrode) 25 is formed on the p− type semiconductor layer 11. The first capacitor electrode 25 is in contact with the n type semiconductor region 22 through an opening formed in the insulating film 23. The first capacitor electrode 25 serves as the output terminal Vo of the EMI filter 100, and is connected to a resistance electrode of the resistance 30 and to a drain electrode of the amplifier device 201.

A GND contact region 28 is also formed in the surface of the p− type semiconductor layer 11. A p type (p+ type) impurity of high concentration is diffused in the GND contact region 28. A second capacitor electrode (anode electrode) 26 is in contact with the GND contact region 28 through an opening formed in the insulating film 23.

The pn junction capacitor 20a is formed by a pn junction of the p− type semiconductor layer 11 and the n type semiconductor region 22.

The insulating capacitor 20b is formed as follows. A conducting layer (e.g., polysilicon) 24 is formed on the insulating film 23 on the p− type semiconductor layer 11. The polysilicon 24 is then covered with the insulating film 23. A third capacitor electrode 27 is formed on the insulating film 23, and comes in contact with one end of the polysilicon 24. The second capacitor electrode 26 and the third capacitor electrode 27 are connected and are applied a GND potential. Thereby, the insulating capacitor 20b is formed in which the insulating film 23 serves as a dielectric, the first capacitor electrode 25 as a cathode electrode, and the third capacitor electrode 27 as an anode electrode.

Figure 5A:
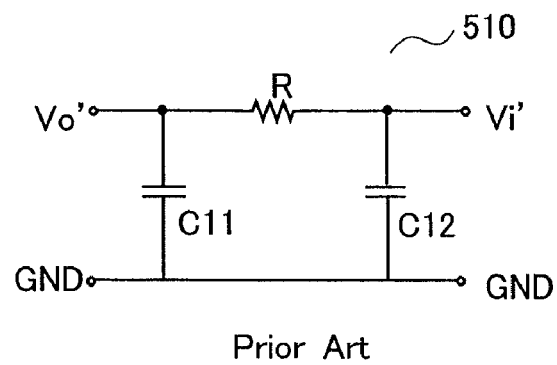
FIGS. 5A and 5B are circuit diagrams for explaining a conventional noise filter.
Figure 5B:
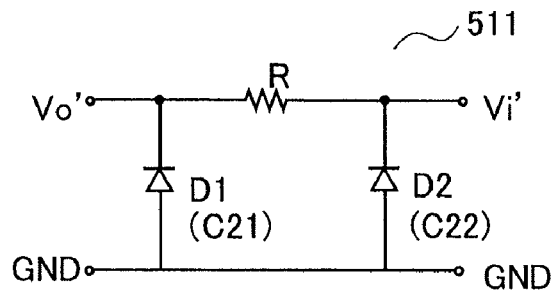
Figure 6:
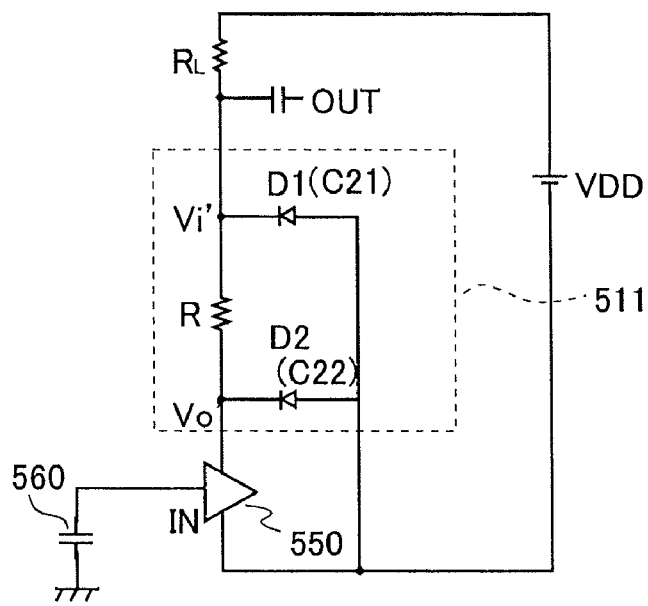
FIG. 6 is a circuit diagram explaining an amplifier circuit in which the conventional noise filter is incorporated.

By connecting the pn junction capacitor 20a and the insulating capacitor 20b in parallel, the capacitance value of the second capacitor 20 can be larger than that of the conventional structure (the capacitor C12 in FIG. 5A and the capacitor C22 in FIG. 5B).

In addition, the insulating capacitor 20b almost overlap with the pn junction capacitor 20a formed on the p− type semiconductor layer 11. Therefore, the area in the noise filter 100 occupied by the second capacitor 20 can be prevented from increasing, while the second capacitor 20 has a structure having an increased capacitance value by the parallel connection of the pn junction capacitor 20a and the insulating capacitor 20b.

According to preferred embodiment of the present invention, first of all, a compact noise filter having a large capacitance value can be provided. Specifically, one of the capacitors (second capacitor) is formed by connecting the pn junction capacitor and the insulating capacitor in parallel. Thereby, a large capacitance value can be obtained without increasing the size of the noise filter.

Secondly, a high resistance effect against ESD can be obtained by employing, as the first capacitor, a junction capacitor of a diode-connected transistor. The insulating capacitor of the second capacitor in particular has a problem of being vulnerable to ESD. However, the second capacitor can be protected from ESD by the snap-back characteristics of the first capacitor, and by the resistance inserted between the first capacitor and the second capacitor.

Thirdly, by the noise-filter-incorporated amplifier integrated circuit device in which the amplifier integrated circuit device and the noise filter are integrated onto the same chip, higher RFI removal characteristics can be accomplished with the same chip size as the conventional structure.

Moreover, if the RFI removal characteristics equivalent to those of the conventional structure should be employed, the chip size can be reduced, allowing cost reduction.

In sum, what can be provided is a compact noise-filter-incorporated amplifier integrated circuit device having excellent RFI removal characteristics and allowing a high resistance effect against ESD.

What is claimed is:

1. A noise filter comprising:
 a junction capacitor comprising a transistor with three terminals in which two of the three terminals are diode-connected;
 a combination capacitor comprising a pn junction capacitor and an insulating capacitor that are connected in parallel; and
 a resistor,
 wherein the resistor is connected to a high voltage side of the junction capacitor to receive an input and is connected to a high voltage side of the combination capacitor to provide an output, and
 a low voltage side of the junction capacitor and a low voltage side of the combination capacitor are connected to a reference voltage.

2. A noise-filter-incorporated amplifier circuit comprising:
 a noise filter comprising a junction capacitor comprising a transistor with three terminals in which two of the three terminals are diode-connected, a combination capacitor comprising a pn junction capacitor and an insulating capacitor that are connected in parallel, and a resistor; and
 an amplifier device,
 wherein the resistor is connected between the junction capacitor and the combination capacitor, a high voltage side of the junction capacitor is configured to be an input terminal of the noise filter, a high voltage side of the combination capacitor is configured to be an output terminal of the noise filter, a low voltage side of the junction capacitor and a low voltage side of the combination capacitor are connected to a reference voltage, and the amplifier device is connected to the output terminal of the noise filter.

3. A noise-filter-incorporated amplifier circuit comprising:
a semiconductor layer of a first conductivity type;
a noise filter formed on the semiconductor layer and comprising a junction capacitor comprising a transistor with three terminals in which two of the three terminals are diode-connected, a combination capacitor comprising a pn junction capacitor and an insulating capacitor that are connected in parallel, and a resistor; and
an amplifier device formed on the semiconductor layer,
wherein the resistor is connected between the junction capacitor and the combination capacitor, a high voltage side of the junction capacitor is configured to be an input terminal of the noise filter, a high voltage side of the combination capacitor is configured to be an output terminal of the noise filter, a low voltage side of the junction capacitor and a low voltage side of the combination capacitor are connected to a reference voltage, and the amplifier device is connected to the output terminal of the noise filter.

4. The noise-filter-incorporated amplifier circuit of claim 3, wherein the combination capacitor comprises a semiconductor region of a second conductivity type opposite from the first conductivity type formed in the semiconductor layer of the first conductivity type, an insulating layer formed on the semiconductor region, and a conducting layer formed on the insulating layer, and the semiconductor layer and the semiconductor region forms the pn junction capacitor, and the semiconductor region, the insulting layer and the conducting layer forms the insulating layer capacitor.

5. The noise-filter-incorporated amplifier circuit of claim 4, wherein the pn junction capacitor and the insulating capacitor overlap each other at least partially in plan view of the amplifier circuit.

\* \* \* \* \*